(12) United States Patent
Jolliffe et al.

(10) Patent No.: US 9,451,714 B2
(45) Date of Patent: Sep. 20, 2016

(54) HOUSING COMPONENTS OF HANDHELD ELECTRONIC DEVICES

(71) Applicant: Gurit (USA) Inc., Bristol, RI (US)

(72) Inventors: Garry Christopher Jolliffe, Bristol, RI (US); Chai Zachary Pocknett, Gloucester, MA (US); Sam Shehyee Ang, Barrington, RI (US); Richard Alden Downs-Honey, Little Compton, RI (US); Matthew Evan Bodoff, East Greenwich, RI (US)

(73) Assignee: Gurit (USA) Inc., Bristol, RI (US)

( * ) Notice: Subject to any disclaimer, the term of this patent is extended or adjusted under 35 U.S.C. 154(b) by 602 days.

(21) Appl. No.: 13/724,434

(22) Filed: Dec. 21, 2012

(65) Prior Publication Data
US 2014/0177138 A1    Jun. 26, 2014

(51) Int. Cl.
| | |
|---|---|
| *H05K 5/02* | (2006.01) |
| *H05K 5/00* | (2006.01) |
| *B29C 43/02* | (2006.01) |
| *H04M 1/02* | (2006.01) |
| *B29L 31/34* | (2006.01) |
| *B29K 105/04* | (2006.01) |

(52) U.S. Cl.
CPC .............. *H05K 5/02* (2013.01); *B29C 43/02* (2013.01); *H04M 1/026* (2013.01); *H05K 5/0086* (2013.01); *B29K 2105/04* (2013.01); *B29L 2031/3437* (2013.01); *B29L 2031/3481* (2013.01); *Y10T 29/49* (2015.01); *Y10T 156/103* (2015.01); *Y10T 428/1234* (2015.01); *Y10T 428/13* (2015.01); *Y10T 428/1303* (2015.01); *Y10T 428/1348* (2015.01); *Y10T 428/1376* (2015.01)

(58) Field of Classification Search
CPC .............. H05K 5/02; H05K 5/0086; Y10T 428/1234; Y10T 428/1376; Y10T 156/103; Y10T 428/13; Y10T 428/1303; Y10T 29/49; Y10T 428/1348; B29C 43/02; B29L 2031/3481; B29L 2031/3437; B29K 2105/04
See application file for complete search history.

(56) References Cited

U.S. PATENT DOCUMENTS

| 4,136,220 | A | 1/1979 | Olabisi | |
|---|---|---|---|---|
| 2002/0193459 | A1* | 12/2002 | Haseyama | B29C 44/348 521/155 |
| 2005/0196588 | A1 | 9/2005 | Suzuki | |
| 2009/0208766 | A1 | 8/2009 | Suzuki et al. | |
| 2012/0142810 | A1 | 6/2012 | Buhler et al. | |

FOREIGN PATENT DOCUMENTS

| DE | 29904922 U1 | 4/2000 |
|---|---|---|
| EP | 1803551 A1 | 4/2007 |

OTHER PUBLICATIONS

International Search Report and Written Opinion mailed Jun. 5, 2014 in corresponding International Application No. PCT/IB2013/060866.

* cited by examiner

*Primary Examiner* — Michael C Miggins
(74) *Attorney, Agent, or Firm* — Polsinelli PC

(57) ABSTRACT

A housing component of a handheld electronic device, the housing component comprising a cellular material which has a density of from 0.02 to 0.6 g/cc and a Young's modulus of from 32 to 5500 Mpa, the cellular material being three-dimensionally shaped to form a substantially resilient body. There is also disclosed a method of manufacturing a housing component of a handheld electronic device, the method comprising the steps of: a. providing a cellular material; and b. three-dimensionally shaping the cellular material to form a substantially resilient body in the form of a housing component of a handheld electronic device.

18 Claims, 1 Drawing Sheet

HOUSING COMPONENTS OF HANDHELD ELECTRONIC DEVICES

FIELD OF INVENTION

The present invention relates to a housing component of a handheld electronic device. The present invention also relates to a method of manufacturing a housing component of a handheld electronic device. The housing component of the invention may be integral with the device, for example a fixed housing or casing part, or separate from the device, for example a removable protective cover or case, or a part thereof.

BACKGROUND OF INVENTION

Currently, it is known to make various handheld electronic devices such as mobile phones, e-readers, and tablet computers and similar devices. It is important to the user that such devices have a lightweight construction so that they are readily portable. Many known handheld electronic devices incorporate a plurality of lightweight components in order to reduce the weight of the device. For example, known handheld electronic devices include housing components such as a chassis, which supports the screen, battery, central processing unit (CPU) and other electronic hardware, a back cover, a front cover, an intermediate hardware enclosure, and a protective case. Such housing components are typically composed of solid plastics material, which may be fiber reinforced or unreinforced, and/or solid lightweight metals.

The plastics materials include polycarbonate, having a typical density of 1.2 g/cc, and fiber reinforced polycarbonate, having a typical density of 1.4 g/cc. Such plastics are used due to their properties of low density, stiffness, damage resistance and tolerance, and ability to be formed or moulded into three-dimensional shapes.

The lightweight metals include aluminum, having a typical density of 2.7 g/cc, and magnesium, having a typical density of 1.7 g/cc. These particular metals are used due to their low density relative to other common metals.

It is current known in the art to employ solid metal and plastics material, either unreinforced or fiber reinforced, in the form of castings to obtain the desired component shape. The casting may additionally be subjected to computer numeric control (CNC) machining to incorporate fine details in shape and configuration, in particular to trim excess material, form cavities, and remove non-essential material to achieve further weight reduction. In some applications, external components which include a surface visible to the user may receive an aesthetic coating or treatment in order to enhance the aesthetic appearance and sensory feel of the device by the end user.

As newer models of handheld electronic devices are introduced, the achievement of even greater weight reduction is a key selling point, in addition to the provision of the desired functional capabilities of these devices. However, the achievement of reduced weight must not compromise the achievement of the essential functional and aesthetic requirements of the handheld electronic device, in particular the need for the housing components to exhibit suitable stiffness, damage tolerance, and the desired end user experience of the unit.

There is a need in the art for a housing component of a handheld electronic device which can provide not only reduced weight but also increased mechanical performance, in particular stiffness and resistance or tolerance to damage.

There is also a need in the art for a housing component of a handheld electronic device which can provide reduced weight as compared to known such housing components without compromising mechanical performance, so that the overall unit weight of the handheld electronic device can be reduced.

There is furthermore a need in the art for a housing component of a handheld electronic device which can provide the combination of reduced weight and improved or equivalent mechanical performance without substantially increasing, or even reducing, the unit cost of the housing component.

SUMMARY OF INVENTION

The present invention aims at least partially to meet one or more of the above-specified needs.

The present invention also aims to provide a lightweight housing component of a handheld electronic device, which can deliver significant weight reduction while maintaining suitable product stiffness and damage tolerance in applications serving as one or more of an integral housing component such as an enclosure, a chassis, a cover and a removable component such as a protective cover or case of a handheld electronic device, for example a housing components such as a chassis, adapted to support one or more of the screen, battery, central processing unit (CPU) and other electronic hardware of the device, a back cover, a front cover, an intermediate hardware enclosure, and a removable protective cover or case.

The present invention accordingly provides a housing component of a handheld electronic device, the housing component comprising a cellular material which has a density of from 0.02 to 0.6 g/cc and a Young's modulus of from 32 to 5500 Mpa, the cellular material being three-dimensionally shaped to form a substantially resilient body.

The housing component of the invention may be integral with the device, for example a fixed housing or casing part, or separate from the device, for example a removable protective cover or case, or a part thereof.

Optionally, the cellular material has at least one external surface which has been three-dimensionally shaped by at least one of machining and compression molding.

Optionally, the cellular material is composed of at least one of a cellular polymer foam material having open or closed cells, a honeycomb material and a natural wood material. Further optionally, the polymer foam material is composed of at least one of polyvinylchloride, polyurethane, polyethylene terephthalate, polymethacrylimide, polyetherimide, polyethersulfone, polystyrene, styrene acrylonitrile, and polysulfone; the honeycomb material is composed of at least one of paper, aluminum, and aramid reinforced polypropylene; and the natural wood material is composed of at least one of balsa, cork and pine.

Optionally, the cellular material has a density of from 0.08 to 0.4 g/cc and a Young's modulus of from 32 to 650 Mpa.

Optionally, the housing component further comprises at least one surface layer on at least a part of at least one surface of the cellular material. Further optionally, the at least one surface layer comprises a molded integral skin on the cellular material. Still further optionally, the integral skin is molded from same material as the cellular material.

Optionally, at least one surface layer comprises at least one of a thermoplastic laminate film and a reinforcement adhered on the cellular material. Further optionally, the thermoplastic laminate film comprises at least one of an adhesive film, a stiffener film and an aesthetic surface film.

In some embodiments, the adhesive film has a thickness of from 25 to 130 microns, the stiffener film has a thickness of from 120 to 300 microns and the aesthetic surface film has a thickness of from 200 to 700 microns.

Optionally, the thermoplastic laminate film is composed of at least one of polyurethane, polyethylene, polypropylene, polyvinylchloride, acrylonitrile butadiene styrene, polyester, and polycarbonate.

Optionally, at least one surface layer comprises a coating applied on the cellular material. Further optionally, the coating is composed of at least one of a polymeric resin, a paint, and a metallic plating.

Optionally, at least one surface layer is applied to one surface or two opposite surfaces of the cellular material.

Optionally, at least one surface layer has a density of from 0.05 to 7.2 g/cc, further optionally from 0.05 to 5.2 g/cc.

Optionally, at least one surface layer is three-dimensionally shaped in common with the adjacent surface of the cellular material and/or complementary with the adjacent surface of the cellular material. Further optionally, the at least one surface layer has been three-dimensionally shaped together with the cellular material by at least one of machining and compression molding.

Optionally, the cellular material includes a plurality of openings in the form of holes or surface contouring in order to reduce the weight of the housing component without locally reducing the overall thickness of the housing component in the vicinity of the holes or surface contouring.

Optionally, the housing component is selected from a chassis, a back cover, a front cover, an intermediate hardware enclosure, and a protective case of the handheld electronic device. Typically, the handheld electronic device is selected from a mobile phone, a cellphone, an e-reader, a tablet computer, a laptop computer, a netbook, an audio player, a video or still image player or camera, and a portable data storage device.

The present invention further provides a method of manufacturing a housing component of a handheld electronic device, the method comprising the steps of:
 a. providing a cellular material; and
 b. three-dimensionally shaping the cellular material to form a substantially resilient body in the form of a housing component of a handheld electronic device, the shaped cellular material having a density of from 0.02 to 0.6 g/cc and a Young's modulus of from 32 to 5500 Mpa.

Optionally, step b comprises machining which three-dimensionally shapes at least one external surface of the cellular material.

Alternatively, step b may optionally comprise compression molding which three-dimensionally shapes at least one external surface of the cellular material. Typically, the compression molding compresses the cellular material, for example the compression molding compressing at least a portion of the cellular material by a compression ratio of from 1:1 to 25:1 and/or from a thickness of from 1 to 50 mm to a thickness of from 0.5 to 25 mm.

Optionally, at least one surface layer is provided on at least a part of at least one surface of the cellular material before or after shaping step b.

In some embodiments, at least one surface layer is provided on at least a part of at least one surface of the cellular material before step b, and is shaped during step b to form a molded integral skin on the cellular material. Typically, the integral skin is molded from same material as the cellular material.

In some embodiments, the at least one surface layer is provided on at least a part of at least one surface of the cellular material before step b and comprises at least one of a thermoplastic laminate film and a reinforcement adhered on the cellular material, and is shaped during step b. Typically, the thermoplastic laminate film comprises at least one of an adhesive film, a stiffener film and an aesthetic surface film. For example, the adhesive film may have a thickness of from 25 to 130 microns, the stiffener film a thickness of from 120 to 300 microns and/or the aesthetic surface film a thickness of from 200 to 700 microns.

Optionally, the thermoplastic laminate film is composed of at least one of polyurethane, polyethylene, polypropylene, polyvinylchloride, acrylonitrile butadiene styrene, polyester and polycarbonate.

In some embodiments, the at least one surface layer comprises a coating applied on the cellular material. Typically, the coating is composed of at least one of a polymeric resin, a paint, and a metallic plating.

In some embodiments, the at least one surface layer is applied to one surface or two opposite surfaces of the cellular material.

Optionally, the at least one surface layer has a density of from 0.05 to 7.2 g/cc, typically from 0.05 to 5.2 g/cc.

In some embodiments, the at least one surface layer is three-dimensionally shaped in common with the adjacent surface of the cellular material and/or complementary with the adjacent surface of the cellular material. Typically, the at least one surface layer has been three-dimensionally shaped in step b together with the cellular material by at least one of machining and compression molding.

Optionally, the cellular material provided in step a includes a plurality of openings in the form of holes or surface contouring in order to reduce the weight of the cellular material without locally reducing the overall thickness of the housing component in the vicinity of the holes or surface contouring.

In some embodiments, the housing component is selected from a chassis, a back cover, a front cover, an intermediate hardware enclosure, and a protective case of the handheld electronic device. The handheld electronic device is typically selected from a mobile phone, a cellphone, an e-reader, a tablet computer, a laptop computer, a netbook, an audio player, a video or still image player or camera, and a portable data storage device.

The present invention further provides a handheld electronic device selected from a mobile phone, a cellphone, an e-reader, a tablet computer, a laptop computer, a netbook, an audio player, a video or still image player or camera, and a portable data storage device, the handheld electronic device incorporating or in combination with the housing component of the present invention or produced by the method of the present invention.

BRIEF DESCRIPTION OF THE DRAWINGS

Embodiments of the present invention will now be described by way of example only, with reference to the accompanying drawings, in which.

DETAILED DESCRIPTION OF THE PREFERRED EMBODIMENTS

Figure 1:
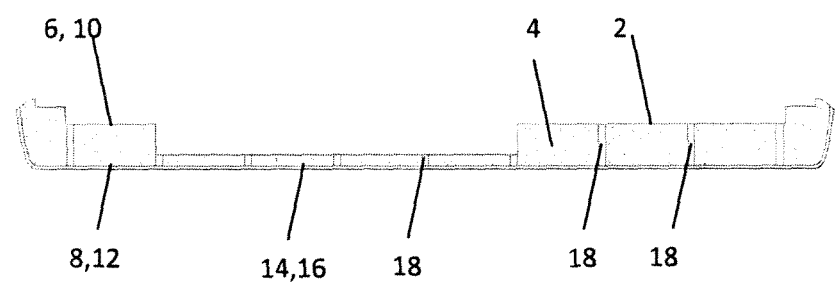
FIG. 1 is a schematic cross-section through a housing component of a handheld electronic device in accordance with a first embodiment of the present invention.

Referring to FIG. 1, there is illustrated a housing component 2 of a handheld electronic device in accordance with a first embodiment of the present invention.

The housing component 2 has been shaped to constitute a monobody chassis and back cover of an e-reader. However, in other embodiments of the invention the housing component 2 is shaped to form any one of a chassis, a front cover, an intermediate hardware enclosure, or a protective case, or any similar part, of any handheld electronic device selected from a mobile phone, a cellphone, an e-reader, a tablet computer, a laptop computer, a netbook, an audio player, a video or still image player or camera, and a portable data storage device, or any similar device. The chassis may comprise a support structure for the screen, battery, CPU and/or other electronic hardware for the device.

The housing component 2 comprises a cellular material 4 which has a density of from 0.02 to 0.6 g/cc and a Young's modulus of from 32 to 5500 Mpa. Typically, the cellular material 4 has a density of from 0.08 to 0.4 g/cc and a Young's modulus of from 32 to 650 Mpa. In this specification the Young's modulus is measured according to the testing protocol of ISO 844:2007. The cellular material 4 has been three-dimensionally shaped to form a substantially resilient body.

In one embodiment, the cellular material 4 includes a plurality of openings 18 in the form of holes or surface contouring in order to reduce the weight of the housing component 2 without locally reducing the overall thickness of the housing component 2 in the vicinity of the holes or surface contouring.

The cellular material 4 has at least one external surface 6, 8 which has been three-dimensionally shaped by at least one of machining and compression molding. In this embodiment both surfaces 6, 8 have been shaped, the surface 6 comprising or being located towards an inner surface 10 of the housing component 2 and the surface 8 comprising or being located towards an outer surface 12 of the housing component 2.

The cellular material 4 is composed of a synthetic or natural material, and preferably of at least one of a cellular polymer foam material having open or closed cells, a honeycomb material and a natural wood material.

The polymer foam material may be composed of at least one of polyvinylchloride, polyurethane, polyethylene terephthalate, polymethacrylimide, polyetherimide, polyethersulfone, polystyrene, styrene acrylonitrile, and polysulfone.

The honeycomb material may be composed of at least one of paper, aluminum, and aramid reinforced polypropylene.

The natural wood material may be composed of at least one of balsa, cork and pine.

The housing component 2 further comprises at least one surface layer 14 on at least a part of at least one surface 6, 8 of the cellular material 4. In this embodiment there is a single surface layer 14 forming the outer surface 12 of the housing component 2. However, in other embodiments there may be no surface layer or layers on the cellular material 4. Typically, the surface layer has a density of from 0.05 to 7.2 g/cc, more typically from 0.05 to 5.2 g/cc.

In this embodiment, the surface layer 14 comprises a molded integral skin 16 on the cellular material 4. The integral skin 16 may be molded from the same material as the cellular material 4, or a different material.

In various embodiments the surface layer 14 comprises a thermoplastic laminate film or a reinforcement adhered on the cellular material 4. The thermoplastic laminate film may comprise an adhesive film, a stiffener film or an aesthetic surface film. Typically, the adhesive film has a thickness of from 25 to 130 microns, the stiffener film has a thickness of from 120 to 300 microns and/or the aesthetic surface film has a thickness of from 200 to 700 microns. Preferably, the thermoplastic laminate film is composed of at least one of polyurethane, polyethylene, polypropylene, polyvinylchloride, acrylonitrile butadiene styrene, polyester, and polycarbonate.

The surface layer 14 may optionally comprises a multi-layer structure comprising a plurality of any of the above-specified layers in any number and combination.

In other embodiments, the surface layer 14 comprises a coating applied on the cellular material 4. Typically, the coating is composed of at least one of a polymeric resin, a paint, and a metallic plating.

As described above, any of these surface layers may be applied to one surface 6, 8 or two opposite surfaces 6, 8 of the cellular material 4.

In the illustrated embodiment, the surface layer 14 is three-dimensionally shaped in common with the adjacent surface 8 of the cellular material 4. The surface layer 14 is three-dimensionally shaped complementary with the adjacent surface 8 of the cellular material 4. In the preferred embodiments, the surface layer 14 has been three-dimensionally shaped together with the cellular material 4 by machining and/or compression molding.

Figure 2:
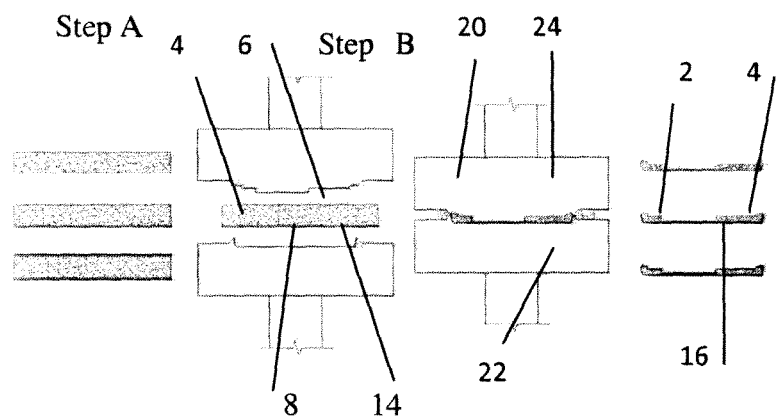
FIG. 2 is a schematic flow diagram of a method of manufacturing a housing component of a handheld electronic device in accordance with a second embodiment of the present invention.

Referring to FIG. 2, there is shown a schematic flow diagram of a method of manufacturing a housing component of a handheld electronic device in accordance with a second embodiment of the present invention. The method may manufacture the housing component 2 of FIG. 1.

In FIG. 2, three alternative starting material structures of different embodiments of the invention are shown on the left hand side which form respective housing components on the right hand side. The top alternative includes no surface layer, the middle alternative (which is shown being molded in the mold) has a surface layer on one side to form an outer surface of the housing component and the lower alternative has a respective surface layer on each side to form outer and inner surfaces of the housing component.

The method comprises an initial step A of providing a cellular material 4 as described hereinabove.

Then is a subsequent step B the cellular material 4 is three-dimensionally shaped to form a substantially resilient body in the form of a housing component 2 of a handheld electronic device. In the housing component 2 the shaped cellular material 4 has a density of from 0.02 to 0.6 g/cc and a Young's modulus of from 32 to 5500 Mpa, typically a density of from 0.08 to 0.4 g/cc and a Young's modulus of from 32 to 650 Mpa.

In the illustrated embodiment, step B comprises compression molding the cellular material 4 which three-dimensionally shapes at least one external surface 6, 8 of the cellular material 4, in the illustrated embodiment the opposite external surface 6, 8 of the cellular material 4 being compression molded. The compression molding compresses the cellular material 4, and typically compresses at least a portion of the cellular material 4 by a compression ratio of from 1:1 to 25:1 and/or from a thickness of from 1 to 50 mm to a thickness of from 0.5 to 25 mm.

In the compression molding step, the mold 20 typically comprises first and second complementary mold tools 22, 24 which respectively mold the inner and outer surfaces of the component 2. The mold tools 22, 24 may be unheated or heated using a temperature controller. The cellular material 4 to be molded, and any surface layer 14 thereon, may optionally be pre-heated.

In an alternative embodiment, step B comprises computer numeric controlled (CNC) machining, which three-dimensionally shapes at least one outer surface 6, 8 of the cellular material 4. If compression molding is employed in the shaping step, computer numeric controlled (CNC) machining may be used thereafter in a trimming operation or to form fine detail in the housing component 2.

As described above, at least one surface layer 14 is provided on at least a part of at least one surface 6, 8 of the cellular material 4 before or after shaping step B. In the illustrated embodiment, the surface layer 14 is provided on the external surface 8 of the cellular material 4 before compression molding step B, and is shaped during compression molding step B to form a molded integral skin 16 on the cellular material 4. In one embodiment, the integral skin 16 is molded from same material as the cellular material 4.

In other embodiments, the surface layer 14 is provided on the cellular material 4 before shaping step B and is shaped during step B, and comprises at least one of a thermoplastic laminate film and a reinforcement adhered on the cellular material,. The thermoplastic laminate film may comprise at least one of an adhesive film, a stiffener film and an aesthetic surface film, as described hereinabove.

In some embodiments, the at least one surface layer 14 is three-dimensionally shaped during step B in common with the adjacent surface 6, 8 of the cellular material 4. This can provide that the at least one surface layer 14 is three-dimensionally shaped complementary with the adjacent surface 6, 8 of the cellular material 4, with the surface layer 14 being three-dimensionally shaped in step B together with the cellular material 4 by machining and/or compression molding.

In some embodiments, the skin may be applied to one or both external surfaces of the cellular material 4 to provide resulting in large surface area panels ready for final shaping into components by CNC machining and/or compression molding.

In other embodiments, the cellular material 4 may be first shaped by CNC machining, or compression molding using temperature controlled or uncontrolled molds, with or without pre-heating of material, then skins applied to component after shaping.

The preferred embodiments of the present invention therefore provide a method to manufacture light weight enclosure components, which may be integral with the device, for a variety of handheld electronic devices, and aftermarket protective cases or covers, which are removable from the device.

The preferred embodiments of the present invention accordingly provide synthetic or natural lightweight cellular structured materials, in combination with a structural and/or aesthetic skin. The resultant moulded body, forming a housing component, can result in significant weight savings over current materials, by replacing all or part of current high density materials (1.2 g/cc-2.7 g/cc) with low density cellular structured materials (0.02 g/cc-0.6 g/cc) and skins.

By designing an optimum combination of cellular structured material and skin, on a single or both sides of the cellular structured material, and component thickness and shape, suitable stiffness, damage tolerance, and end-user experience is achieved while reducing weight of the device.

In particularly preferred embodiments, the tooling for compression molding can be designed to mold multiple components per cycle, making this technique viable for large scale production, for example manufacturing multi-million units per month.

Various other embodiments, additions and modifications to the present invention will readily be apparent to those skilled in the art and are encompassed within the scope of the invention as defined in the appended claims.

What is claimed is:

1. A housing component of a handheld electronic device, the housing component comprising:
   a cellular material which has a density of from 0.08 to 0.4 g/cc and a Young's modulus of from 32 to 650 Mpa,
   the cellular material being three-dimensionally shaped to form a substantially resilient body,
   the cellular material is composed of a cellular polymer foam material having having open or closed cells, and the polymer foam material is composed of at least one of polyyinylchloride, polyurethane, polyethylene terephthalate, polymethacrylimide, polyetherimide, polyethersulfone, polystyrene, styrene acrylonitrile, and polysulfone and
   further comprising at least one surface layer on at least a part of at least one surface of the cellular material, wherein the at least one surface layer comprises a molded integral skin on the cellular material or at least one of a thermoplastic laminate film and a reinforcement adhered on the cellular material.

2. The housing component of claim 1 wherein the cellular material has at least one external surface which has been three-dimensionally shaped by at least one of machining and compression molding.

3. The housing component of claim 1, wherein the integral skin is molded from same material as the cellular material.

4. The housing component of claim 1 wherein the thermoplastic laminate film is composed of at least one of polyurethane, polyethylene, polypropylene, polyvinylchloride, acrylonitrile butadiene styrene, polyester and polycarbonate.

5. The housing component of claim 1 wherein the at least one surface layer is applied to one surface or two opposite surfaces of the cellular material.

6. The housing component of claim 1 wherein the at least one surface layer is three-dimensionally shaped in common with the adjacent surface of the cellular material.

7. The housing component of claim 1 wherein the cellular material includes a plurality of openings in the form of holes or surface contouring in order to reduce the weight of the housing component without locally reducing the overall thickness of the housing component in the vicinity of the holes or surface contouring.

8. The housing component of claim 1 wherein the thermoplastic laminate film comprises at least one of an adhesive film, a stiffener film and an aesthetic surface film.

9. The housing component of claim 8 wherein the adhesive film has a thickness of from 25 to 130 microns, the stiffener film has a thickness of from 120 to 300 microns and the aesthetic surface film has a thickness of from 200 to 700 microns.

10. The housing component of claim 1 wherein the at least one surface layer comprises a coating applied on the cellular material.

11. The housing component of claim 10 wherein the coating is composed of at least one of a polymeric resin, a paint, and a metallic plating.

12. The housing component of claim 1 wherein the at least one surface layer has a density of from 0.05 to 7.2 g/cc.

13. The housing component of claim 12 wherein the at least one surface layer has a density of from 0.05 to 5.2 g/cc.

14. The housing component of claim 1 wherein the at least one surface layer is three-dimensionally shaped complementary with the adjacent surface of the cellular material.

15. The housing component of claim 14 wherein the at least one surface layer has been three-dimensionally shaped together with the cellular material by at least one of machining and compression molding.

16. The housing component of claim 1 which is selected from a chassis, a back cover, a front cover, an intermediate hardware enclosure, and a protective case of the handheld electronic device.

17. The housing component of claim 16 wherein the handheld electronic device is selected from a mobile phone, a cellphone, an e-reader, a tablet computer, a laptop computer, a netbook, an audio player, a video or still image player or camera, and a portable data storage device.

18. A handheld electronic device selected from a mobile phone, a cellphone, an e-reader, a tablet computer, a laptop computer, a netbook, an audio player, a video or still image player or camera, and a portable data storage device, the handheld electronic device incorporating or in combination with the housing component of claim 1.

* * * * *

UNITED STATES PATENT AND TRADEMARK OFFICE
CERTIFICATE OF CORRECTION

PATENT NO.        : 9,451,714 B2                                          Page 1 of 1
APPLICATION NO.   : 13/724434
DATED             : September 20, 2016
INVENTOR(S)       : Jolliffe et al.

It is certified that error appears in the above-identified patent and that said Letters Patent is hereby corrected as shown below:

In The Claims
In column 8, line 19 (claim 1), delete "polyyvinylchloride" and insert --polyvinylchloride--

Signed and Sealed this
Twenty-ninth Day of November, 2016

Michelle K. Lee
*Director of the United States Patent and Trademark Office*